United States Patent [19]

Johnston et al.

[11] B 4,000,456
[45] Dec. 28, 1976

[54] ENGINE DIAGNOSTIC APPARATUS

[75] Inventors: Eugene Dale Johnston, Roseville; Sydney J. Roth, Edina, both of Minn.; Joseph A. Marino, Waukesha, Wis.

[73] Assignee: Applied Power Inc., Milwaukee, Wis.

[22] Filed: Aug. 7, 1974

[21] Appl. No.: 495,331

[44] Published under the second Trial Voluntary Protest Program on March 16, 1976 as document No. B 495,331.

[52] U.S. Cl. .............................. 324/15; 324/16 R; 324/16 S; 307/239; 328/231
[51] Int. Cl.² .................. G01R 13/42; G01R 23/00
[58] Field of Search ................. 324/15, 16 R, 16 T, 324/16 S; 315/209; 307/239; 328/231

[56] References Cited
UNITED STATES PATENTS

| | | | |
|---|---|---|---|
| 3,573,608 | 4/1971 | Marino et al. | 324/16 S |
| 3,576,462 | 4/1971 | Wanninger | 324/16 S |
| 3,650,149 | 3/1972 | Howes | 324/16 S |
| 3,777,559 | 12/1973 | Rennick et al. | 324/16 S |

*Primary Examiner*—Saxfield Chatmon, Jr.
*Attorney, Agent, or Firm*—Frederick E. Lange

[57] ABSTRACT

Engine diagnostic apparatus for displaying on a cathode ray tube the voltage conditions existing at each of the spark plugs which apparatus is intended for use with ignition systems in which the voltage pulses applied to the spark plugs are of such short duration that a cathode ray tube will not properly respond to the changes of voltage. The apparatus is effective to successively charge a capacitor to a value corresponding to the value of each voltage pulse and the voltages across this capacitor are used to control the vertical deflection of the cathode ray tube. At the end of a first period of time following a voltage pulse, the capacitor is shorted. The capacitor is maintained shorted for a longer period of time less than the time between successive pulses so as to avoid undesired charging of the capacitor as a result of transient conditions. The time constant of the charging circuit for the capacitor is less than the duration of the voltage peak so that the capacitor is substantially fully charged during the voltage peak.

4 Claims, 3 Drawing Figures

ENGINE DIAGNOSTIC APPARATUS

BACKGROUND OF THE INVENTION

It is quite customary in the engine diagnostic art to employ a cathode ray tube and to vertically shift the position of the horizontal trace in accordance with the voltage appearing across the plugs. This voltage is indicative of various conditions such as compression, condition of the plug, etc. In recent years, the time during which a voltage pulse is applied to the plug has become extremely short. This has been particularly true in connection with capacitor discharge types of ignition. It is obviously desirable that the ignition take place as quickly as possible and with a capacitor discharge type of system, this becomes possible. The problem, however, that is introduced when the length of the voltage pulse applied to the plug is very short is that it is difficult for the cathode ray tube to respond to this extremely short pulse. Even if such features as a trace brightener circuit are added, it is still very hard to get an accurate indication of the height of the pulse. This is particularly true when it is considered that these oscilloscopes are often used in relatively dirty locations where the screen tends to get covered with a film of grease. Furthermore, the lighting is often not too desirable for proper reading of a cathode ray tube.

SUMMARY OF THE PRESENT INVENTION

The present invention is concerned with engine diagnostic apparatus of the type employing a cathode ray tube in which the voltage pulse applied to each plug is not displayed directly upon the screen but is applied to an energy storing device, such as a capacitor, which in turn is connected through a suitable amplifier to the vertical displacement electrodes of the cathode ray tube. The capacitor or the energy storing device is connected into a circuit in which the energy is maintained in the device with very little loss. At the same time, the apparatus provides a timer which at the end of a fixed period of time deenergizes the energy storing device thus causing the voltage applied to the vertical displacement electrodes to drop to zero. This is repeated for each voltage pulse. The result of it is a series of square waves of predetermined width the height of which is dependent upon a magnitude of the voltage pulse. The result of this is that it becomes possible to readily read the magnitude of the voltage pulse and determine whether this voltage pulse is above or below a desired value. In order to guard against transient conditions introducing energy into the energy storing device between voltage pulses, there is a second timer which maintains the energy storage device deenergized for a period of time less than the minimum time between voltage pulses.

As indicated above, the energy storage device normally takes the form of a capacitor which is charged in accordance with the magnitude of the voltage pulse and which is connected in a circuit which prevents its discharge until it is discharged by the timer previously referred to. It is also connected to the vertical displacement electrodes of the cathode ray tube by a circuit which causes very little drain in the charge on the capacitor. Thus, the capacitor maintains its full charge until discharged by the timing apparatus. Furthermore, the second timer, referred to, maintains the capacitor short circuited until a period of time has elapsed which period of time is still less than the minimum time between successive voltage pulses even when the engine is being operated at its normal maximum speed.

DESCRIPTION OF THE PREFERRED EMBODIMENT

Figure 1:
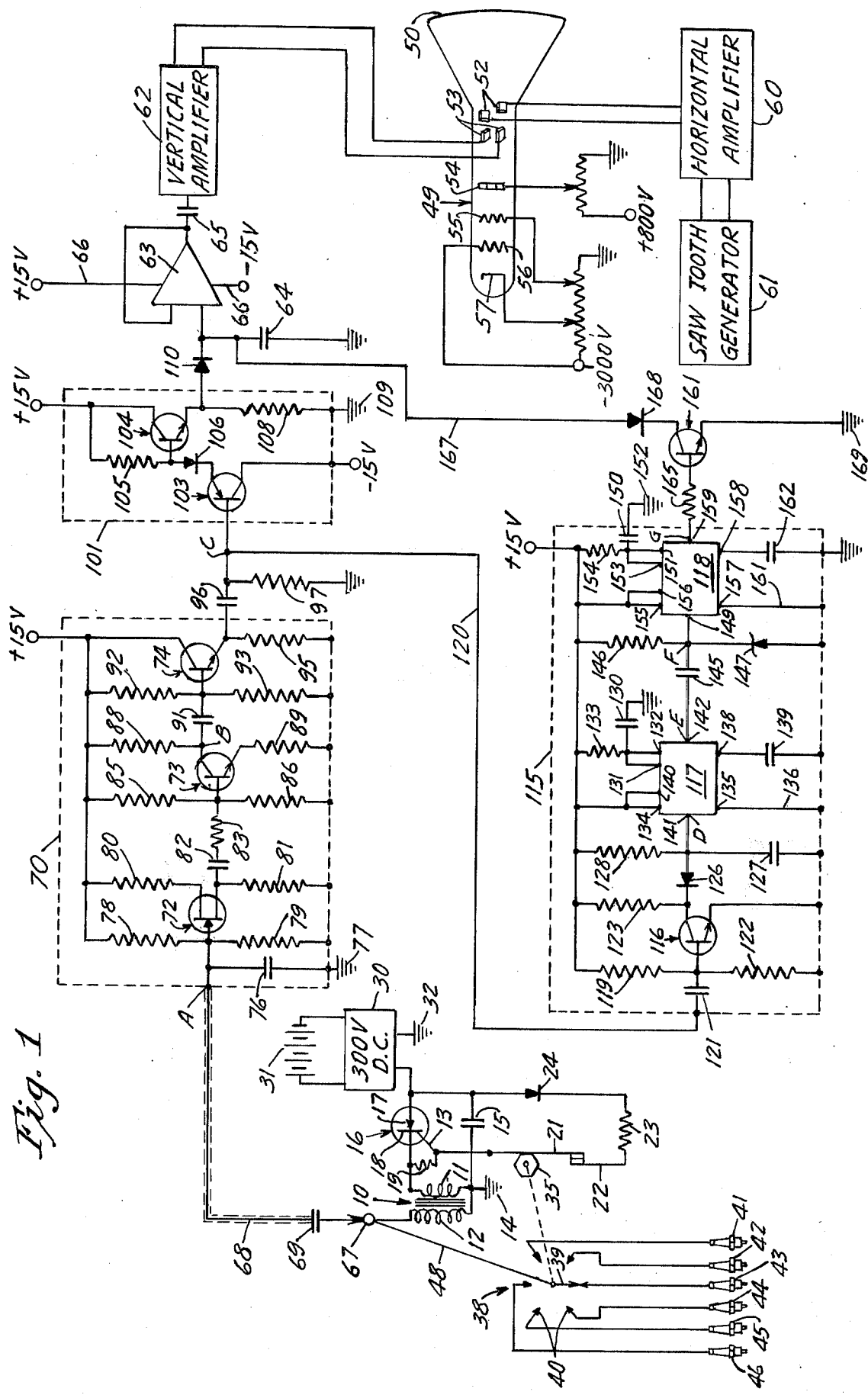
FIG. 1 is a schematic view of the engine diagnostic apparatus of the present invention.

Referring to FIG. 1, I have shown the apparatus connected to an automobile ignition system of the capacitor discharge type, this type of ignition system being schematically shown in the drawing. Referring to this automobile ignition system, which has been illustratively shown in connection with a six-cylinder engine, the numeral 10 indicates the usual ignition coil having a low voltage primary winding 11 and a high voltage secondary winding 12. Both the lower end of the low voltage primary winding 11 and that of the high voltage winding 12 are connected to ground at 14. The low voltage secondary winding 11 is adapted to be energized by the discharge of a capacitor 15 which is connected across the low voltage secondary winding 11 through a silicon controlled recitifer 16, such rectifiers commonly being referred to as SCR's. The SCR 16 comprises the usual anode 17, cathode 18 and gate electrode 13. The capacitor 15 is connected to the upper terminal of the low voltage primary winding 11 through a circuit including the anode 17 and the cathode 18 of the SCR. The gate electrode is normally connected to the cathode by a resistor 19. It is adapted to be connected to the anode under the control of a switch comprising movable switch blade 21 and a fixed switch blade 22, the switch blades 21 and 22 constituting the conventional breaker points. The switch blade 21 is connected to the gate electrode 19 whereas the fixed switch blade 22 is connected through a resistor 23 and a diode 24 to the anode 17. It will be obvious that whenever switch blades 21 and 22 are closed, the gate electrode 19 is connected suddenly to the anode 17 so that the gate electrode 19 assumes a value much higher than the cathode potential and so as to cause firing of the SCR 16 to enable the capacitor 16 to be discharged through the low voltage primary 11.

The capacitor 15 is normally connected to a power supply 30 which has input terminals connected to the usual automobile storage battery 31. The power supply 30 is designed to deliver a relatively high voltage such as 300 volts D.C. to the positive terminal of capacitor 15, the opposite terminal of the capacitor being connected through the ground connections 14 and 32 back to the power supply 30. The capacitor 15 is thus normally maintained fully charged at a relatively high voltage until it is discharged through the low voltage winding 11 by the SCR 16 as a result of the closing of the switch contacts 21 and 22.

Cooperating with the switch blade 21 is a six sided cam 35 which serves to separate switch blades 21 and 22 six times for each revolution of cam 35. The numeral 38 indicates the conventional distributor having a distributor arm 39 which is driven by the engine along with the cam 35 and sequentially makes contact with a plurality of terminals 40, each of which is connected to a different one of the igniters 41 through 46, which igniters normally take the form of conventional spark plugs. The various igniters 41 through 46 are each associated with a different cylinder, igniter 41 being associated with cylinder 1, for example. While we have shown the igniters or spark plugs as located in a continuous row, it is to be understood that they are associated with the cylinders in such a manner as to produce the desired firing sequence. The rotating arm 39 of the distributor is connected in the conventional manner to the high tension or upper terminal of secondary winding 12 through a conductor 48. Upon rotation of the distributor, the voltage across winding 12 is successively applied to the various igniters or spark plugs in the desired firing sequence.

Turning now to the improved engine analyzing apparatus, a cathode ray tube of conventional type is designated by the reference numeral 49. This tube has the usual fluorescent screen 50, horizontal deflecting plates 52, vertical deflecting plates 53, accelerating anode 54, grid 55, control grid 56, and cathode 57. The cathode is provided with any conventional means for heating the same (not shown). As is conventional with such a cathode ray tube, when used as an oscilloscope, a beam of electrons emitted from the cathode 57 passes through an aperture in the anode and is variably deflected depending upon the voltages applied between the deflecting plates 52 and 53. The beam will impinge upon the screen 50 and its point of impingement will depend upon the amount of deflection produced by the deflecting plates 52 and 53. In the operation of such a cathode ray tube as an oscilloscope, it is conventional to apply a sawtooth voltage between the horizontal plates 52 so that the cathode ray beam is horizontally moved from one side of the screen 50 to the other at a frequency dependent upon the frequency of the sawtooth voltage. A signal representing the information to be displayed is then placed upon the vertical deflection plates causing deflection of the beam in a vertical direction by an amount and at a time dependent upon the characteristic of the information to be displayed. The horizontal deflection plates 52 are shown as connected to a horizontal amplifier 60 which in turn is connected to a sawtooth generator 61. As is conventional, the sawtooth generator 61 is periodically triggered by a signal derived from the ignition system (by means not shown) so that the operation of the sawtooth generator and hence of the horizontal amplifier is synchronized with that of the automobile ignition system. This type of arrangement is conventional and the details thereof form no part of our invention. Hence, the details of the sawtooth generator 61 and the horizontal amplifier 60 will not be discussed herein.

The invention is, however, very much concerned with the manner in which the voltage applied to the vertical deflecting plates 53 is controlled. In the first place, as is conventional, these deflecting plates 53 are connected to the output terminals of a vertical amplifier 62 of conventional construction. The input terminals of this vertical amplifier are supplied with a voltage from an amplifier 63 which in turn has its input controlled in accordance with a charge on a capacitor 64 as will be presently discussed. Briefly, this capacitor 64 is successively charged to a voltage depending upon the voltage across the secondary winding 12 of the ignition coil and is then after a fixed time period discharged and maintained discharged for a longer period of time.

The amplifier 63 is connected between the capacitor 64 and the vertical amplifier 62 to act as an isolation amplifier to prevent any appreciable drain on the charge of capacitor 64. In one particular instance, it was found desirable to employ a 741 operational amplifier connected so as to provide unity gain. The amplifier is connected by conductors 66 to a +15 volt source of power and a −15 volt source of power to energize the amplifier. The upper terminal of capacitor 64 is connected to the input terminal of this amplifier. As previously indicated, the amplifier, while providing no voltage gain, does effectively isolate the capacitor from any appreciable sources of current drain so that the capacitor 64 can control the vertical amplifier 62 without any appreciable loss of charge. A capacitor 65 is connected between the amplifier 63 and vertical amplifier 62 to block any D.C. voltage. Capacitor 65 is sufficiently large, however, as not to appreciably affect the voltage applied by the vertical amplifier to the vertical deflection plates 52 during the relatively short period of time that the voltage across capacitor 64 is applied to the input terminals of amplifier 63.

The apparatus for charging the condenser 64 to a voltage dependent upon the secondary voltage of the ignition coil 10 will now be described. Connected to the upper terminal of the high voltage secondary winding 12 of ignition coil 10 by a suitable detachable connection 69 is a shielded cable 68. A capacitor 67 is interposed in this connection and preferably forms part of the connection so as to provide a readily detachable electrostatic connection between the shielded cable 68 and the upper terminal of the high voltage secondary 12. The shielded cable 68 is connected to the input terminal A of a preamplifier generally indicated by the reference numeral 70. The preamplifier 70 is composed of three stages in which there is respectively a field effect transistor 72 and two NPN transistors 73 and 74. The first stage including the field effect transistor 72 acts to provide a high impedance to a low impedance stage; in other words, this stage has a high impedance input and a relatively low impedance output. The second stage including NPN transistor 73 acts as an inverter amplifier. The last stage including transistor 74 is connected as an emitter follower and acts as a buffer stage. The preamplifier 70 will now be described in more detail.

Figure 2:
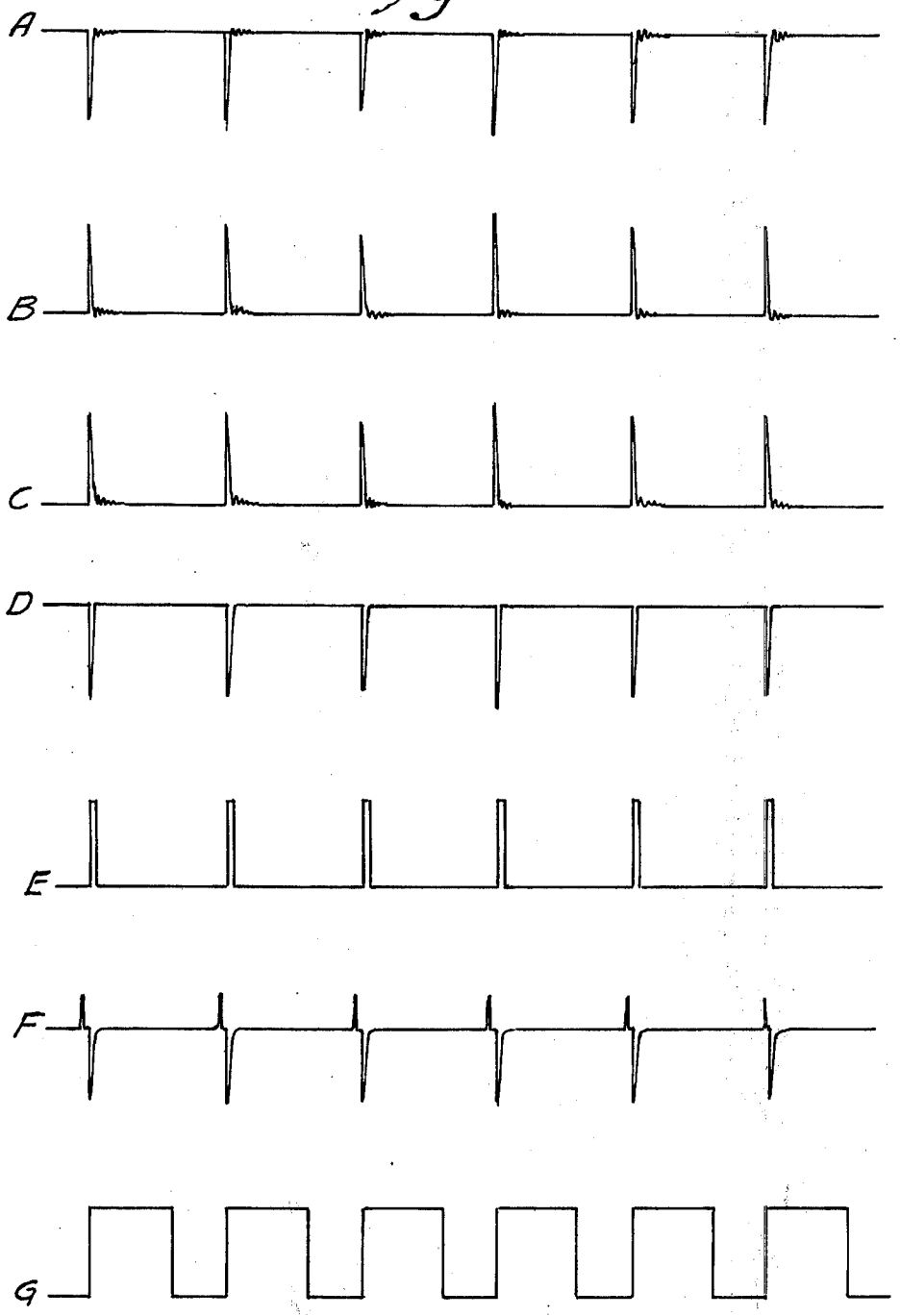
FIG. 2 is a schematic view showing various electrical wave forms at different points in the circuit.

The input terminal A of the preamplifier 70 is connected through a capacitor 76 to the grounded case of the preamplifier, the ground being indicated by the reference numeral 77. The capacitor 76 along with capacitor 69 act as a voltage divider so that a predetermined portion of the voltage across the secondary winding 12 is applied to the gate of the field effect transistor 72, the upper terminal of capacitor 76 being connected to the gate. The gate is normally maintained at a predetermined potential by being connected to the junction of two resistors 78 and 79 which are connected between a + 15 volt source and the grounded housing of the preamplifier. The drain electrode of the field effect transistor is connected through a resistor 80 to the + 15 volt source and the source electrode is connected through a resistor 81 to ground. The voltage across resistor 81 existing between the source electrode and ground is applied to the base of transistor 73 through a capacitor 82 and a resistor 83. The base of transistor 73 is normally maintained at a predetermined potential by a connection to the junction of two further resistors 85 and 86 connected between the + 15 volt source and ground. The output of this stage of the preamplifier is taken off of point B and this stage acts as an inverter amplifier. Referring to FIG. 2 in which the various wave forms are shown, it will be noticed that the voltage pulses at point A consist of a series of rather sharp negative voltage pulses followed by a slight oscillatory wave in each case. The voltage at point B consists of a series of positive voltage pulses which are generally in phase with the negative voltage pulses at point A. It will be noted that point B which is the collector terminal of transistor 73 is connected through a resistor 88 to the + 15 volt power source whereas the emitter of transistor 73 is connected through resistor 89 to ground. Point B is connected through a capacitor 91 to the base of transistor 74. The base is also connected to the junction of two resistors 92 and 93 connected between the 15 volt power source and ground. The collector of transistor 74 is connected to the + 15 volt power source whereas the emitter is connected through a resistor 95 to ground. The output from this stage including transistor 74 is taken across the resistor 95 causing this stage to act as an emitter follower stage. The output is connected through a further capacitor 96 to a point C, there being a further resistor 97 connected between this point and ground. The voltage at point C is shown in FIG. 2 and it will be noted that this consists of a series of positive peaks generally in phase with the negative peaks at point A resulting from the voltage pulses across the secondary. It will be noted that some of these pulses are slightly shorter than others and other slightly higher than the norm thus these pulses reflect the differences in the various pulses received at point A which in turn reflects variations in conditions at the various cylinders.

The voltage at point C is used in two different way. In the first place, it is passed through a charging circit amplifier, generally designated by the reference numeral 101, to an upper terminal of capacitor 64 to cause this capacitor to be periodically charged in accordance with the magnitude of the various pulses at point C. The charging circuit 101 comprises two transistors, one a PNP transistor 103 and the other an NPN transistor 104. The emitter of the transistor 103 is connected through a resistor 105 and a diode 106 to the + 15 volt power source. The function of diode 106 is to cause transistor 104 always to be slightly conductive, as will be explained in more detail later. The junction between the diodes 106 and resistor 105 is connected to the base of transistor 104. The collector of transistor 103 is connected to a −15 volt source. The collector of NPN transistor 104 is connected to the +15 volt source whereas the emitter is connected through a resistor 108 to ground at 109. The output of this stage of the charging circuit is applied through a rectifier 110 to the capacitor 64. Because the impedance between the collector and emitter of transformer 104 is very small when the transistor is conductive the time constant of the circuit from the +15 volt source through the rectifier and capacitor is extremely low to enable the capacitor to be very guickly charged to a voltage which is proportionate to the voltage pulse at point A.

The function of the rectifier 110 is to prevent any discharge of the capacitor 64 through resistor 108. The voltage across capacitor 64, as previously noted, is applied to the operational amplifier 63 which is so designed to act as an isolation amplifier providing very little drain upon the charge across capacitor 64. thus, the capacitor 64, until discharged by the timing circuit to be presently described, is applied through the vertical amplifier to maintain the horizontal trace of the cathode ray tube deflected by an amount proportional to the particular voltage pulse being applied at the moment.

The timing circuit will now be discussed. This timing circuit is generally indicated by the reference numeral 115 and comprises an NPN transistor 116 and a plurality of timers 117 and 118. The output terminal C of the preamplifier is connected through a conductor 120 and a capacitor 121 to the gate of the NPN transistor 116. This gate is connected to the junction of two resistors 119 and 122 connected in series between a +15 volt power source and the grounded case of the timing circuit housing. The collector of this transistor is connected through a resistor 123 to the +15 volt power source while the emitter is connected to ground. The transistor 116 serves as an amplifier to amplify the voltage from point C before it is applied to the timers 117 and 118. The voltage at the collector of transistor 116 is connected through a diode 126 to the upper terminal of a capacitor 127 which is connected across the input terminals of the timer 117. At the same time, the upper terminal of capacitor 127 is connected through a resistor 128 to the +15 volt power source. The reason for the diode 126 is that the resistor 128 is relatively high in value as compared with resistor 123. If the diode 126 were not present, there would be a tendency for the capacitor 127 to be charged from the current through resistor 123 and not through the relatively high resistor 128. The timer 117 is a typical integrated circuit timer of the type commercially sold as a 555 timing circuit. The timing period of the circuit is determined by a capacitor 130 which is connected between discharge and threshold terminals 131 and 132 of timing circuit 117 and ground. Terminals 131 and 132 are further connected through a resistor 133 to the +15 volt power supply. The power supply terminal 134 is connected to this +15 volt power source. The ground terminal 135 is connected to the grounded case of the timing circuit through a conductor 136. The control voltage terminal 138 of the timer 117 is connected through a capacitor 139 to ground. Threshold terminal 140 is simply tied directly to the said terminal 134 since, for the purpose for which the timer 117 is being used, these two terminals can be connected together. The input to the timer is connected to the input terminal 141 and the ouput at point E is taken off of the output terminal 142. As previously pointed out, the timer 117 is a conventional 555 linear integrated circuit. In the case of a 555 unit of Signetics Corporation, the terminals 131, 132, 134, 135, 138, 140, 141, and 142 correspond respectively to terminals 7, 6, 8, 1, 5, 4, 2 and 3 of the Signetics 555 timer. Of course, it is understood that other timing devices can be employed. The function of timer 117 is to produce a series of timing periods relatively short in duration which are initiated at the beginning of each voltage pulse derived across the secondary of the ignition coil and at the end of which the timing period of timer 118 is initiated. In one particular example of the equipment, the value of the timing capacitor 130 was so selected as to provide a timing period of approximately 75 microseconds. The output at terminal E is shown in FIG. 2 at E. It will be noted that it does consist of a series of timing periods defined by pulses which are relatively narrow in width. These pulses are all uniform in height since the variations in the magnitude of the voltage pulses derived from the secondary transformer do not affect the magnitude of the pulses derived from the timer, all of these pulses having a magnitude corresponding to the magnitude of the supply voltage, for example, 15 volts.

The output of the timer 117 is, in turn, used to control the second timer 118 which, as will be presently explained, has a substantially longer timing period. The output terminal 142 is connected through a capacitor 145 to the junction of a resistor 146 and a Zener diode 147 which are connected in series between the +15 volt power source and the grounded case of the timing apparatus. The Zener diode 147, in one embodiment, was selected so as to maintain negative peaks of exactly 10 volts. As will be noted from wave form F in FIG. 2, the effect of passing the output of timing circuit 117 through the capacitor 145 is to produce a wave form having small positive peaks and negative peaks which, because of the Zener diode, are of exactly 10 volts in magnitude, in the embodiment being discussed. The further effect of the Zener diode is to bypass the positive peaks so that the peaks supplied to the input terminal 49 of the timer 118 is a series of negative peaks, each with an amplitude of 10 volts and each of which occurs at the end of the timing period of timer 117. The timing period of timer 118 is controlled by a capacitor 150 which is of substantially greater magnitude than the timer 130 to provide a longer timing period. This capacitor 150 is connected between the discharge and threshold terminals 151 and 153 and ground at 152. The discharge and threshold terminals 151 and 153 are also connected to the +15 volt power supply through a resistor 154. The power supply terminal 155 and reset terminal 156 are likewise connected together and to the +15 volt power supply. The ground terminal 157 is connected directly to the grounded case through a conductor 161. The control voltage terminal 158 is connected through a capacitor 162 to the grounded case. As in the case of timer 117, the timer 118 may be a 555 linear integrated circuit and the terminals 149, 151, 153, 155, 156, 157, 158, and 159 correspond to the terminals of such a standard circuit. Where a Signetics Corporation 555 linear integrated circuit is used, the terminals 149, 151, 153, 155, 156, 157, 158, and 159 correspond respectively to terminals 2, 7, 6, 8, 4, 1, 5 and 3 of such a circuit.

The capacitor 150 is picked, in this case, to provide a timing period of approximately 1 millisecond. This timing period is sufficiently large to cover much of the period between the firing of two plugs when the engine is running at a relatively low speed, but is sufficiently short that when the engine is operated at its normal maximum speed, the timing period is less than the timing period between the firing of two plugs. As will be presently explained, this longer timing period is to maintain the capacitor 64 shorted as long as possible to prevent the possibility of it being accidentally charged by some transient voltage. Voltage at point G at the output terminal 159 is shown in FIG. 2 and it will be noted that it consists of a series of square waves each of which is initiated at the termination of the very narrow square waves of FIG. E and which continue for a much longer time than the narrow pulses of FIG. E. This output is connected through a resistor 165 to the base of an NPN transistor 161 which acts to short the capacitor 64 at the appropriate times.

The upper terminal of capacitor 64 is connected through a conductor 167, a diode 168, and the collector-emitter terminals of transistor 161 to ground at 169. Thus, when the transistor 161 is conductive, a shorting circuit is established from the upper terminal of capacitor 64 through conductor 167, diode 168, transistor 161, and ground. The purpose of diode 168 is to produce a voltage drop of about 0.4 volts which when added to the voltage drop across the collector-emitter portions of the transistor 161 produces a total voltage drop equivalent to that which normally is present across the capacitor 64 if no signal is being received. In describing the functions of transistors 103 and 104, reference was made to the diode 106. The purpose of this diode is to provide that the base has a slight positive potential when the transistor 103 is conductive to in turn cause transistor 104 to be somewhat conductive even in the absence of a signal. This means that there is always at least a small amount of current flowing through the collector and emitter of transistor 104, the diode 110, and the input circuit of amplifier 63. The reason for this is that it is assured that the diode 110 has already become conductive and any subsequent change in signal will immediately affect the charge on the capacitor 64. The result of this is, however, that there is always about a 0.7 volt drop across the capacitor 64 even when no signal is being received through conductor 68. Because of the blocking capacitor 65, this small steady voltage across capacitor 64 has no effect upon the input to vertical amplifier and hence causes no deflection of the vertical trace. By incorporating the diode 168, the voltage drop of which along with the voltage drop across transistor 161, is equal to this normal voltage drop across capacitor 64, the input to amplifier 63 is exactly the same when the capacitor is being shorted by transistor 161 as when no signal is being applied.

The purpose of the timing circuit 115 is to insure that at the end of a timing period equal to the timing period of timer 117, the capacitor 64 will be shorted for a period of time equal to the timing period of timer 118. Thus, the capacitor 64 will be maintained at a charge corresponding to the voltage across the particular plug which is being fired at the time and is for a period of time equal to the timing period of timer 117. At the end of that short period of time, the capacitor 64 will be discharged and will be maintained discharged for a period of time equal to the timing period of timer 118.

Figure 3:
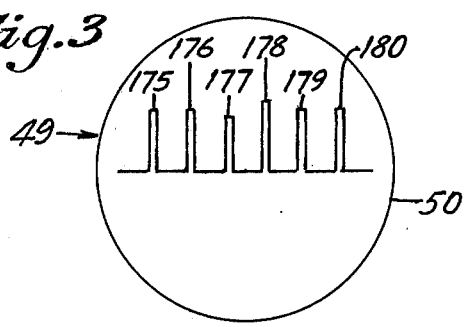
FIG. 3 is a view of a cathode ray screen showing a typical display obtained with the apparatus of our invention.

The effect of this is that the horizontal trace of the cathode ray tube will be deflected by an amount equal to the voltage across the plug in question and for a period of time equal to the timing period of timer 117. This period of time is sufficiently short that it will actually appear on the cathode ray tube simply as a heavy line. In FIG. 3, there is depicted the showing of the vertical deflections that are caused by reason of the firing of the six plugs of a conventional six cylinder engine. It will be noted that there are six peaks 175 through 180. While, for purposes of illustration, these are shown as rectangular peaks of a finite width, these peaks actually will show up as wide lines as indicated above. It will be noted that the peak 177 is slightly lower than the majority of the peaks while peak 178 is slightly higher. This corresponds to the difference in the height of the voltage pulses.

While the invention is not limited to the use of components having any particular values, we have found it desirable in one particular application of the invention to employ components having the following values:

| Resistors | Capacitors |
|---|---|
| 78 — 22 megohms | 64 — .0033 microfarads |
| 79 — 15 megohms | 65 — 5.6 microfarads |
| 80 — 1,000 ohms | 76 — .0033 microfarads |
| 81 — 18,000 ohms | 82 — 20 microfarads |
| 83 — 10,000 ohms | 91 — 5.6 microfarads |
| 85 — 68,000 ohms | 96 — .1 microfarads |
| 86 — 12,000 ohms | 121 — .1 microfarads |
| 88 — 10,000 ohms | 127 — .01 microfarads |
| 89 — 1,000 ohms | 130 — .001 microfarads |
| 92 — 100,000 ohms | 139 — .01 microfarads |
| 93 — 10,000 ohms | 145 — .001 microfarads |
| 95 — 2,200 ohms | 150 — .01 microfarads |
| 97 — 10,000 ohms | 162 — .01 microfarads |
| 105 — 10,000 ohms | |
| 108 — 1,000 ohms | Transistors |
| 119 — 220,000 ohms | 72 — 2N4220 |
| 122 — 10,000 ohms | 73 — 2N3569 |
| 123 — 2,200 ohms | 74 — 2N3569 |
| 128 — 10,000 ohms | 103 — 2N3644 |
| 133 — 68,000 ohms | 104 — 2N3566 |
| 146 — 10,000 ohms | 116 — 2N3566 |
| 154 — 82,000 ohms | 161 — 2N3566 |

As noted above, these values are illustrative only of one particular embodiment that was successfully operated and is not intended to in any way limit the scope of the invention.

OPERATION OF THE APPARATUS

It is believed that the operation of the apparatus will be fairly clear from the foregoing description. When it is desired to test an automobile engine, the lead 68 is attached to the high voltage terminal of the secondary winding by the detachable connector 67. This results in a series of voltage pulses being transmitted through the capacitor 69 and conductor 68 to the input terminal A of preamplifier 70. The output of the preamplifier is indicated by the wave form at point C in FIG. 2. It will be noted that this is in the form of a series of pulses, one for each plug associated with the engine, the height of these pulses varying with the signal received at point A. The pulses are then passed through the charging circuit 101 and the output is used to periodically charge the capacitor 64. The charge on capacitor 64 is applied through the operational amplifier 63 and the vertical amplifier 62 to the vertical deflecting plates 53 to cause the beam to be deflected by an amount dependent upon the charge across condenser 64 which in turn is dependent upon the voltage across the plug which is being fired at that time. The presence of the blocking condenser 65 does not prevent this charge from being applied through the vertical amplifier to the vertical deflection plates since the capacitor 65 has a relatively high value to offer relatively low impedance to the pulses which are derived from the charge across the condenser. Because the duration of these pulses is relatively short as a result of the action of timer 117, the length of the pulse is not sufficiently long to cause any particular attenuation thereof in its showing on the cathode ray screen by reason of the capacitor 65.

At the same time as the signal at point C is transmitted to the charging circuit, this signal is also applied to the timing circuit 115 to initiate the timing action of timer 117. After a short predetermined period of time such as 75 microseconds, the action of timer 118 is initiated. The output of this timer is employed to render the transistor 161 conductive to cause discharge of the capacitor 64. The capacitor 64 is maintained discharged for the length of the timing period of timer 118 which, as pointed out above, is sufficiently large as to occupy a substantial portion of the time between any two successive pulses when the engine is run at a fairly high rate of speed. At the same time, the time is less than that between two existing pulses when the engine is run at its normal maximum speed. As a result of this, the capacitor 64 is maintained discharged during much of the time between the successive pulses produced by the successive charging of capacitor 64. This minimizes the tendency of erratic deflection of the screen of the cathode ray tube as a result of transient conditions.

CONCLUSION

It will be seen that we have provided an engine diagnostic apparatus in which it is possible despite extremely short duration of an ignition voltage pulse to produce upon the cathode ray screen a trace which has sufficient duration to provide a relatively wide, readily visible trace which can be easily examined as to magnitude.

While we have shown a specific embodiment for purposes of illustration, it is to be understood that the scope of the invention is limited solely by that of the appended claims.

We claim as our invention:

1. Apparatus for displaying a condition associated with the operation of a multi-cylinder internal combustion engine having an ignition system including an igniter for each cylinder for igniting the fuel within the cylinder and an electrical voltage pulse generating means for successively applying voltage pulses very short in duration to each of said igniters to cause energization thereof, said apparatus comprising:
   a cathode ray tube having a display screen,
   means for producing a horizontal trace on said screen,
   vertical deflection means for variably displacing said horizontal trace in a vertical direction by an amount and for a length of time dependent upon the magnitude and duration of a deflection signal applied to said means,
   means including an energy storing means adapted to be connected to said voltage pulse generating means for storing energy in said storing means in an amount dependent upon the magnitude of the voltages across said igniters applied by said generating means,
   means connecting said energy storing means to said vertical deflection means for causing said horizontal trace to be deflected by an amount dependent upon the magnitude of the voltages across said igniters as long as said capacitor remains charged,
   first timing means connected to said energy storage means and to said igniters for successively deenergizing said energy storing means a short first predetermined period of time after the voltage pulse is first applied to each of said igniters so that the vertical deflection of said trace is terminated after the end of said first predetermined period of time, and
   second timing means for maintaining said energy storage means deenergized for a second predetermined period of time which is very large compared with said first period of time but less than the time between successive voltage pulses of said voltage pulse generating means even when the engine is being operated at its normal upper limit of speed.

2. The apparatus of claim 1 in which the energy storage means is a capacitor which is charged to a value dependent upon the magnitude of the voltage across said igniter and in which the first timing means is effective to discharge said capacitor and the second timing means is effective to maintain said capacitor discharged.

3. The apparatus of claim 2 in which the capacitor is connected to said vertical deflection means through circuit means which causes said vertical deflection means to be controlled by the charge on said capacitor without appreciable discharge of said capacitor until said first timing means is effective to discharge the same.

4. The apparatus of claim 1 in which the second period of time is at least ten times that of the first period of time.

* * * * *